(12) United States Patent
Bower et al.

(10) Patent No.: US 8,934,259 B2
(45) Date of Patent: Jan. 13, 2015

(54) SUBSTRATES WITH TRANSFERABLE CHIPLETS

(75) Inventors: Christopher Bower, Raleigh, NC (US); Joseph Carr, Chapel Hill, NC (US)

(73) Assignee: Semprius, Inc., Durham, NC (US)

( * ) Notice: Subject to any disclaimer, the term of this patent is extended or adjusted under 35 U.S.C. 154(b) by 104 days.

(21) Appl. No.: 13/491,335

(22) Filed: Jun. 7, 2012

(65) Prior Publication Data

US 2012/0314388 A1    Dec. 13, 2012

Related U.S. Application Data

(60) Provisional application No. 61/494,507, filed on Jun. 8, 2011, provisional application No. 61/494,514, filed on Jun. 8, 2011.

(51) Int. Cl.
*H05K 1/16* (2006.01)
*H01L 21/56* (2006.01)
*H01L 21/683* (2006.01)
*H01L 23/00* (2006.01)

(52) U.S. Cl.
CPC .......... *H01L 21/563* (2013.01); *H01L 21/6838* (2013.01); *H01L 24/13* (2013.01); *H01L 24/81* (2013.01); *H01L 2224/11002* (2013.01); *H01L 2224/7698* (2013.01); *H01L 24/16* (2013.01); *H01L 24/32* (2013.01); *H01L 24/73* (2013.01); *H01L 24/92* (2013.01); *H01L 2221/68354* (2013.01); *H01L 2224/13013* (2013.01);
(Continued)

(58) Field of Classification Search
USPC ............ 361/765, 760; 430/48, 162, 256, 258, 430/302; 428/220; 438/48, 118; 439/66, 86, 439/106; 29/782
See application file for complete search history.

(56) References Cited

U.S. PATENT DOCUMENTS 5,629,132 A * 5/1997 Suzuki et al. ................. 430/258
6,969,624 B2   11/2005 Iwafuchi et al.
(Continued)

OTHER PUBLICATIONS

Hamer et al., "63.2: AMOLED Displays Using Transfer-Printed Integrated Circuits," 2009 Society for Information Display International Symposium Proceedings Jun. 2-5 2009, San Antonio, Texas, vol. 40, Book 2, paper 63.2, pp. 947-950.

*Primary Examiner* — Xiaoliang Chen
(74) *Attorney, Agent, or Firm* — Myers Bigel Sibley & Sajovec, PA

(57) ABSTRACT

A method for fabricating a substrate having transferable chiplets includes forming a photo-sensitive adhesive layer on a process side of a source substrate including active components or on a patterned side of a transparent intermediate substrate. The intermediate substrate is brought into contact with the source substrate to adhere the active components on the process side to the patterned side of the intermediate substrate via the photo-sensitive adhesive layer therebetween. Portions of the source substrate opposite the process side thereof are removed to singulate the active components. Portions of the photo-sensitive adhesive layer are selectively exposed to electromagnetic radiation through the intermediate substrate to alter an adhesive strength thereof. Portions of the photo-sensitive adhesive layer having a weaker adhesive strength are selectively removed to define breakable tethers comprising portions of the adhesive layer having a stronger adhesive strength. The breakable tethers physically secure the active components to the intermediate substrate.

28 Claims, 14 Drawing Sheets

(52) U.S. Cl.
CPC ............ *H01L2224/13017* (2013.01); *H01L 2224/13124* (2013.01); *H01L 2224/13139* (2013.01); *H01L 2224/13144* (2013.01); *H01L 2224/13147* (2013.01); *H01L 2224/13184* (2013.01); *H01L 2224/16227* (2013.01); *H01L 2224/32225* (2013.01); *H01L 2224/73204* (2013.01); *H01L 2224/81193* (2013.01); *H01L 2224/81201* (2013.01); *H01L 2224/81203* (2013.01); *H01L 2224/81411* (2013.01); *H01L 2224/81815* (2013.01); *H01L 2224/83192* (2013.01); *H01L 2224/83855* (2013.01); *H01L 2224/9211* (2013.01); *H01L 2224/97* (2013.01); *H01L 2224/13166* (2013.01); *H01L 2224/16225* (2013.01)

USPC ............ 361/765; 361/760; 430/48; 430/162; 430/256; 430/258; 430/302; 428/220; 438/48; 438/118; 439/66; 439/86; 439/106; 257/782

(56) References Cited

U.S. PATENT DOCUMENTS

| | | | |
|---|---|---|---|
| 7,127,810 | B2 | 10/2006 | Kasuga et al. |
| 7,605,053 | B2 | 10/2009 | Couillard et al. |
| 2003/0211649 | A1* | 11/2003 | Hirai et al. .................. 438/48 |
| 2009/0053498 | A1* | 2/2009 | Matsuura et al. ............ 428/220 |
| 2010/0123134 | A1 | 5/2010 | Nagata |
| 2010/0289115 | A1 | 11/2010 | Akiyama et al. |

* cited by examiner

SUBSTRATES WITH TRANSFERABLE CHIPLETS

CLAIM OF PRIORITY

The present application claims priority under 35 USC §119 to U.S. Provisional Patent Application Ser. No. 61/494,507 entitled "Substrates with Transferable Chiplets," filed on Jun. 8, 2011, the disclosure of which is incorporated by reference herein in its entirety.

CROSS REFERENCE TO RELATED APPLICATIONS

The present application is related to U.S. Provisional Patent Application Ser. No. 61/494,514 entitled "Methods for Surface Attachment of Flipped Active Components," filed on Jun. 8, 2011, the disclosure of which is incorporated by reference herein in its entirety.

FIELD

The present invention is directed to methods for providing substrates having separate electrically active components distributed thereon and related devices.

BACKGROUND

Substrates with electronically active components distributed over the extent of the substrate may be used in a variety of electronic systems, for example flat-panel imaging devices such as flat-panel liquid crystal or organic light emitting diode (OLED) display devices. Substrates with electrically active components are also found in flat-panel solar cells. A variety of methods may be used to distribute electronically active circuits over substrates, including forming the electronically active circuits on a substrate and forming the components on separate substrates and placing them on a substrate. In the latter case, a variety of assembly technologies for device packaging may be used.

Electronically active components made in place are typically formed by sputtering a layer of inorganic semiconductor material or by spin-coating organic material over the entire substrate. Inorganic semiconductor materials can be processed to improve their electronic characteristics, for example amorphous silicon can be treated to form low-temperature or high-temperature poly-crystalline silicon. In other process methods, microcrystalline semiconductor layers can be formed by using an underlying seeding layer. These methods typically improve the electron mobility of the semiconductor layer. The substrate and layer of semiconductor material can be photo-lithographically processed to define electronically active components, such as transistors. Such transistors are known as thin-film transistors (TFTs) since they are formed in a thin layer of semiconductor material, typically silicon. Transistors may also be formed in thin layers of organic materials. In these devices, the substrate is often made of glass, for example Corning Eagle® or Jade® glass designed for display applications.

The above techniques may have some limitations. Despite processing methods used to improve the performance of thin-film transistors, such transistors may provide performance that is lower than the performance of other integrated circuits formed in mono-crystalline semiconductor material. Semiconductor material and active components can be provided only on portions of the substrate, leading to wasted material and increased material and processing costs. The choice of substrate materials may also be limited by the processing steps necessary to process the semiconductor material and the photo-lithographic steps used to pattern the active components. For example, plastic substrates have a limited chemical and heat tolerance and do not readily survive photo-lithographic processing. Furthermore, the manufacturing equipment used to process large substrates with thin-film circuitry is relatively expensive. Other substrate materials that may be used include quartz, for example for integrated circuits using silicon-on-insulator structures as described in U.S. Patent Application 2010/0289115 and U.S. Patent Application 2010/0123134. However, such substrate materials can be more expensive and/or difficult to process.

Other methods used for distributing electronically functional components over a substrate in the circuit board assembly industry include, for example, pick-and-place technologies for integrated circuits provided in a variety of packages, for example, pin-grid arrays, ball-grid arrays, and flip-chips. However, these techniques may be limited in the size of the integrated circuits that can be placed.

In further manufacturing techniques, a mono-crystalline semiconductor wafer is employed as the substrate. While this approach can provide substrates with the same performance as integrated circuits, the size of such substrates may be limited, for example, to a 12-inch diameter circle, and the wafers are relatively expensive compared to other substrate materials such as glass, polymer, or quartz.

In yet another approach, thin layers of semiconductor are bonded to a substrate and then processed. Such a method is known as semiconductor-on-glass or silicon-on-glass (SOG) and is described, for example, in U.S. Pat. No. 7,605,053, issued Oct. 20, 2009. If the semiconductor material is crystalline, high-performance thin-film circuits can be obtained. However, the bonding technique and the processing equipment for the substrates to form the thin-film active components on large substrates can be relatively expensive.

Publication No. 11-142878 of the Patent Abstracts of Japan entitled "Formation of Display Transistor Array Panel" describes etching a substrate to remove it from a thin-film transistor array on which the TFT array was formed. TFT circuits formed on a first substrate can be transferred to a second substrate by adhering the first substrate and the TFTs to the surface of the second substrate and then etching away the first substrate, leaving the TFTs bonded to the second substrate. This method may require etching a significant quantity of material, and may risk damaging the exposed TFT array.

Other methods of locating material on a substrate are described in U.S. Pat. No. 7,127,810. In this approach, a first substrate carries a thin-film object to be transferred to a second substrate. An adhesive is applied to the object to be transferred or to the second substrate in the desired location of the object. The substrates are aligned and brought into contact. A laser beam irradiates the object to abrade the transferring thin film so that the transferring thin film adheres to the second substrate. The first and second substrates are separated, peeling the film in the abraded areas from the first substrate and transferring it to the second substrate. In one embodiment, a plurality of objects is selectively transferred by employing a plurality of laser beams to abrade selected area. Objects to be transferred can include thin-film circuits.

U.S. Pat. No. 6,969,624 describes a method of transferring a device from a first substrate onto a holding substrate by selectively irradiating an interface with an energy beam. The interface is located between a device for transfer and the first substrate and includes a material that generates ablation upon irradiation, thereby releasing the device from the substrate.

For example, a light-emitting device (LED) is made of a nitride semiconductor on a sapphire substrate. The energy beam is directed to the interface between the sapphire substrate and the nitride semiconductor releasing the LED and allowing the LED to adhere to a holding substrate coated with an adhesive. The adhesive is then cured. These methods, however, require the patterned deposition of adhesive on the object(s) or on the second substrate. Moreover, the laser beam that irradiates the object may need to be shaped to match the shape of the object and the laser abrasion can damage the object to be transferred. Furthermore, the adhesive cure takes time, which may reduce the throughput of the manufacturing system.

Another method for transferring active components from one substrate to another is described in "AMOLED Displays using Transfer-Printed Integrated Circuits" published in the Proceedings of the 2009 Society for Information Display International Symposium Jun. 2-5, 2009, in San Antonio Tex., US, vol. 40, Book 2, ISSN 0009-0966X, paper 63.2 p. 947. In this approach, small integrated circuits are formed over a buried oxide layer in a crystalline wafer. The small integrated circuits are released from the wafer by etching the buried oxide layer formed beneath the circuits. A PDMS stamp is pressed against the wafer and the circuits are adhered to the stamp. The circuits are pressed against a destination substrate coated with an adhesive and thereby adhered to the destination substrate. The adhesive is subsequently cured. This method, however, may rely on non-standard and relatively more expensive integrated circuit processes that may increase costs associated with, for example, the formation of the buried oxide layer.

SUMMARY

It should be appreciated that this Summary is provided to introduce a selection of concepts in a simplified form, the concepts being further described below in the Detailed Description. This Summary is not intended to identify key features or essential features of this disclosure, nor is it intended to limit the scope of the disclosure.

According to some aspects of the present invention, in a method of printing transferable components, a photo-sensitive adhesive layer is formed on a process side of a source substrate including active components or on a patterned side of a transparent intermediate substrate. The transparent intermediate substrate is contacted with the source substrate to adhere the active components on the process side to the patterned side of the transparent intermediate substrate via the photo-sensitive adhesive layer therebetween. Portions of the source substrate opposite the process side are removed to singulate the active components. Portions of the photo-sensitive adhesive layer are selectively exposed to electromagnetic radiation through the transparent intermediate substrate to alter an adhesive strength thereof, and then portions of the photo-sensitive adhesive layer having a weaker adhesive strength are selectively removed to define breakable tethers comprising portions of the adhesive layer having a stronger adhesive strength. The breakable tethers physically secure the active components to the transparent intermediate substrate.

In some embodiments, in selectively exposing portions of the photo-sensitive adhesive layer, a mask pattern may be formed on the transparent intermediate substrate, and the transparent intermediate substrate including the mask pattern thereon may be exposed to the electromagnetic radiation. The mask pattern may include a material configured to block transmission of the electromagnetic radiation therethrough such that the portions of the photo-sensitive adhesive layer exposed by the mask pattern are selectively exposed to the electromagnetic radiation.

In some embodiments, the patterned side of the transparent intermediate substrate may include a plurality of structures protruding therefrom, and the mask pattern may be formed on surfaces of the protruding structures.

In some embodiments, the tethers may extend in a direction perpendicular to the transparent intermediate layer and may be shaped to break in a desired manner.

In some embodiments, the active components may have respective primary surfaces including conductive elements thereon adjacent the process side of the source substrate, and respective secondary surfaces opposite the primary surfaces. The portions of the adhesive layer defining the tethers may physically connect the respective the primary surfaces of the active components to the transparent intermediate substrate.

In some embodiments, a stamp having pillars protruding therefrom may be pressed against the active components on the transparent intermediate substrate, and then the stamp may be separated from the transparent intermediate substrate to break the tethers and adhere the respective secondary surfaces of the active components to respective transfer surfaces of the pillars of the stamp. The stamp including the active components on the pillars thereof may be contacted with a destination substrate to adhere the respective primary surfaces of the active components including the conductive elements thereon to a receiving surface of the destination substrate.

In some embodiments, the conductive elements on the respective primary surfaces of the active components may be adhered to respective electrical contacts on the receiving surface of the destination substrate.

In some embodiments, the primary surfaces of the active components may respectively include a photo-adhesive layer residue thereon including respective portions of the breakable tethers. The residue may be below respective surfaces of the conductive elements.

In some embodiments, the portions of the photo-sensitive adhesive layer may be selectively exposed to the electromagnetic radiation to differentially adhere ones of the active components to the transparent intermediate substrate.

According to further aspects of the present invention, an active component array includes at least one printable electronic component including a conductive element on a primary surface thereof. The conductive element is configured to provide an electrical coupling to at least one active element on the primary surface. The at least one electronic component includes a photo-adhesive layer residue on the primary surface thereof. The residue includes a broken portion of a tether configured to adhere the at least one electronic component to a transparent intermediate substrate. The photo-adhesive layer residue includes a material configured to provide altered adhesive strength responsive to exposure to electromagnetic radiation. The active component array further includes destination substrate including one or more electrical contacts on a surface thereof. The at least one electronic component is printed on the destination substrate such that the conductive element on the primary surface thereof is in contact with a respective one of the electrical contacts on the receiving surface of the destination substrate.

According to one aspect of the present invention, a method for fabricating a substrate having transferable chiplets comprises: providing a source substrate having a process side and a plurality of active components formed on or in the process side of the source substrate; providing a transparent intermediate substrate having a patterned side; coating a photo-sensitive adhesive layer on the patterned side of the transparent intermediate wafer or on the active components; adhering the patterned side of the transparent intermediate substrate to the process side of the source substrate; removing portions of the source substrate to singulate the active components and adhere the singulated active components to the patterned side of the transparent intermediate substrate; selectively exposing the photo-sensitive adhesive layer to electromagnetic radiation to alter an adhesive strength thereof such that portions of the photo-sensitive adhesive layer have a weaker adhesive strength than other portions thereof; and selectively removing the portions of the photo-sensitive adhesive layer having the weaker adhesive strength to define breakable tethers comprising the other portions of the photo-sensitive adhesive layer that physically connect the singulated active components to the transparent intermediate substrate.

According to another aspect of the present invention, a transfer device, comprises: a transparent intermediate substrate having a patterned side; a patterned photo-sensitive adhesive layer adhered to the patterned side of the transparent intermediate substrate, the patterned adhesive layer comprising a material configured to provide altered adhesive strength responsive to exposure to electromagnetic radiation; and a plurality of singulated active components adhered to the patterned adhesive layer, the patterned adhesive layer located between the patterned side of the transparent intermediate substrate and the singulated active components, the patterned adhesive layer forming tethers physically connecting the singulated active components to the patterned side of the transparent intermediate substrate.

Embodiments of the present invention provide transferable high-performance active components that can be assembled onto substrates using standard integrated circuit processes at a reduced cost.

Other methods and/or devices according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

Figure 1:
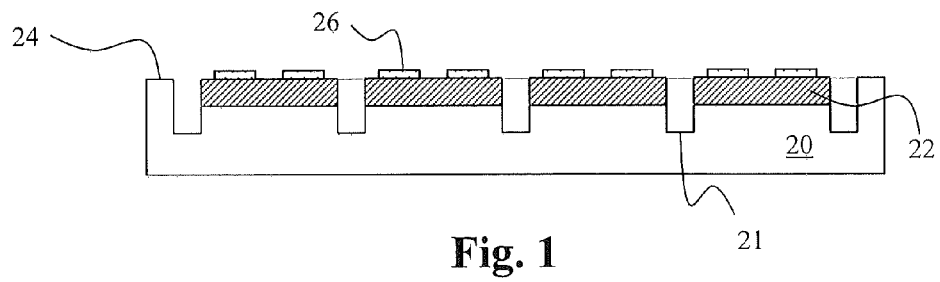
FIG. 1 is a schematic cross-section of a source substrate having active components on a process side in accordance with embodiments of the present invention.

The figures are not drawn to scale since the individual elements of the drawings have too great a size variation to permit depiction to scale.

DETAILED DESCRIPTION OF EMBODIMENTS

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "in contact with" or "connected to" or "coupled to" another element, it can be directly contacting or connected to or coupled to the other element or intervening elements may be present. In contrast, when an element is referred to as being "in direct contact with" or "directly connected to" or "directly coupled to" another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "under" or "lower" or "bottom," and "over" or "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. In other words, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entireties.

Embodiments of the present invention provide methods and devices for the transfer of active components, also referred to herein as 'chiplets,' from a source substrate to a destination substrate. Chiplets are small integrated circuits, each integrated circuit having a separate and distinct substrate so as to define a separate transferable component. FIGS. 1-15 are schematic diagrams illustrating various fabrication operations in various methods according to embodiments of the present invention, while FIGS. 16-20 are flow diagrams describing various fabrication operations in various methods according to embodiments of the present invention. Transferring integrated circuits from the source substrate to the destination substrate is also referred to herein as 'printing' the integrated circuits onto the destination substrate.

Figure 16:
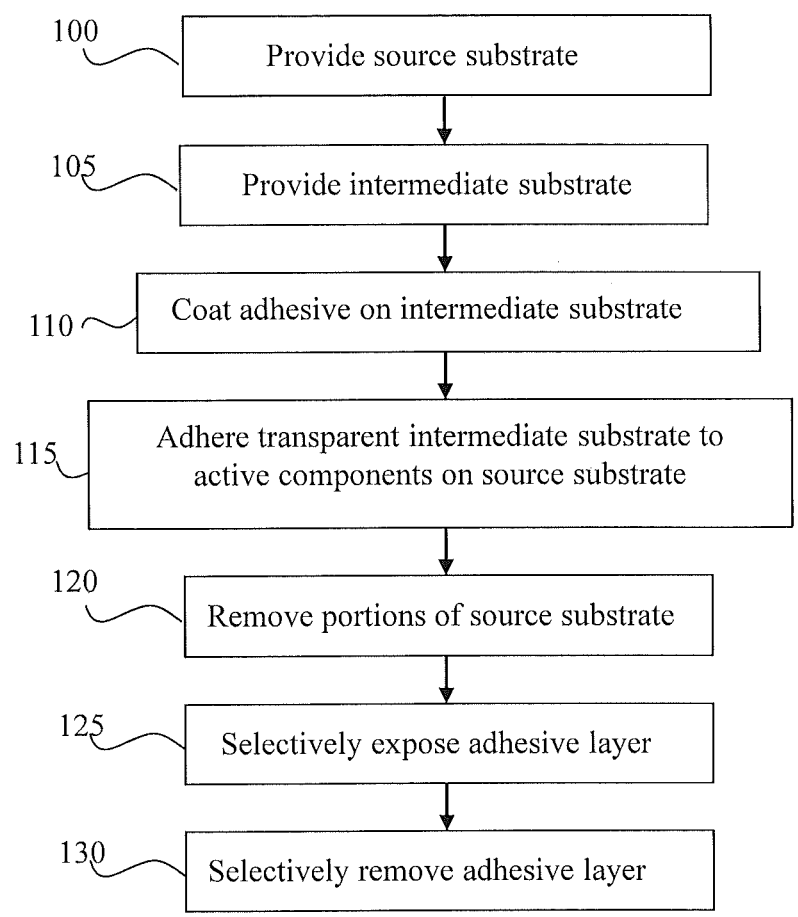
FIG. 16 is a flow diagram illustrating a method in accordance with embodiments of the present invention.

Referring to the flow diagram of FIG. 16 and to the illustration of FIG. 1, some embodiments of the present invention provide a method for fabricating a substrate having transferable chiplets. A source substrate 20 having a process side 24 is provided in step 100. The source substrate 20 can be a wafer having a process side 24 opposite a back side that is used to handle and transport the wafer. Active components 22, also referred to herein as 'chiplets,' are formed on or in the process side 24 of the source substrate 20 and connection pads 26 providing electrical connectivity to the active components 22 are formed on or in the active components 22. The source substrate 20 can be a semiconductor wafer, for example, a silicon or gallium arsenide wafer. The source substrate 20 can be an inert substrate, for example glass, with semiconductor layers formed on or over the inert substrate. The source substrate 20 can have an inert layer (e.g. silicon dioxide) with semiconductor layers formed on or over the inert layer. Semiconductor layers can include crystalline, microcrystalline, polycrystalline, or amorphous materials, according to various embodiments of the present invention.

Figure 17:
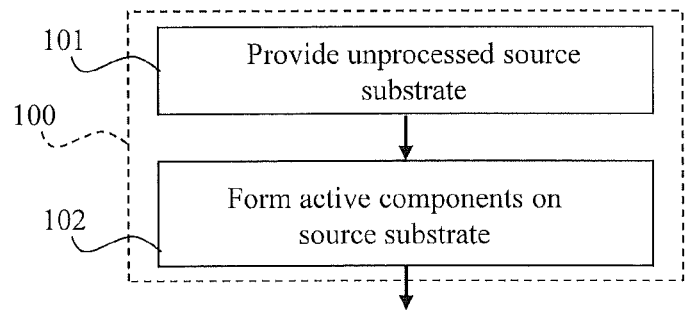
FIG. 17 is a flow diagram illustrating another method in accordance with embodiments of the present invention.

According to some embodiments of the present invention as shown in FIG. 16, the source substrate 20 can be provided with active components 22 and connection pads 26 already formed on the process side 24. Alternatively, as shown in FIG. 17, an unprocessed source substrate 20 can be provided in step 101 and the active components 22 formed on the process side 24 of the source substrate 20 in step 102. According to FIG. 17, an unprocessed source substrate 20 is a substrate that has not yet been processed to form the active components 22. The unprocessed source substrate 20 can have other processing steps completed, for example cleaning, deposition of material layers, or heat or chemical treatments, as are used in the photo-lithographic arts. In step 102, active components 22 are formed, for example using photo-lithographic processes including forming masks over the source substrate 20, etching materials, removing masks, and depositing materials. Using such processes, active components 22 are formed on or in the process side 24 of the source substrate 20. Source substrate trenches or wells 21 are optionally formed between the active components 22 to assist in singulating the active components 22 from the source substrate 20 as described further below.

Active components 22 are small electronic integrated circuits, or chiplets, having a size (for example) of about 5 microns to about 5000 microns in a dimension. The electronic integrated circuits can include semiconductor materials (for example, inorganic materials such as silicon or gallium arsenide, or organic materials) having various structures, including crystalline, microcrystalline, polycrystalline, or amorphous structures. The active components 22 can also include insulating layers and structures such as silicon dioxide, nitride, and passivation layers, and conductive layers or structures including wires made of aluminum, titanium, silver, copper, tungsten, or gold, which can form an electronic circuit. Connection pads 26 can be formed of metals such as aluminum, copper, tin, polysilicon semiconductors, or other interconnection materials used in the integrated circuit packaging industry and can be provided on the top surface of the active components 22. These and other methods and materials used in the integrated circuit arts may be used for making active component 22 electronic circuits. Large numbers of such small integrated circuits are formed on a single source substrate 20. The active components 22 are typically packed as closely as possible to use the surface area of the source substrate 20 as efficiently as possible.

Figure 2A:
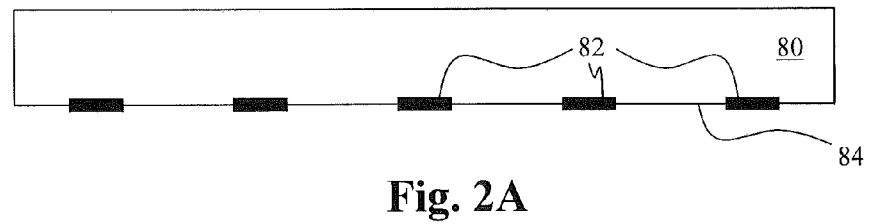
FIG. 2A is a schematic of a transparent intermediate substrate having an optical mask in accordance with embodiments of the present invention.

As shown in FIG. 2A, a transparent intermediate substrate 80 is provided in step 105 (FIG. 16). A transparent intermediate substrate 80 may be part of a transfer device 5 (as shown in FIG. 9) formed in accordance with embodiments of the present invention using a substrate or wafer to remove active components 22 from the source substrate 20. The transparent intermediate substrate 80 is transparent to one or more selected types of electromagnetic radiation, for example light, ultra-violet radiation, or infra-red radiation. The transparent intermediate substrate 80 need not be transparent to all frequencies of electromagnetic radiation nor is it completely transparent, for example it can absorb radiation at all frequencies. For example, the transparent intermediate substrate 80 can be partially transparent and absorb 50% of the electro-magnetic radiation that passes through. However, the transparent intermediate substrate 80 is sufficiently transparent to selected frequencies of electromagnetic radiation to adequately expose desired photo-sensitive materials through the transparent intermediate substrate 80. In various embodiments of the present invention, the transparent intermediate substrate 80 can include a glass substrate or a quartz wafer.

Figure 2B:
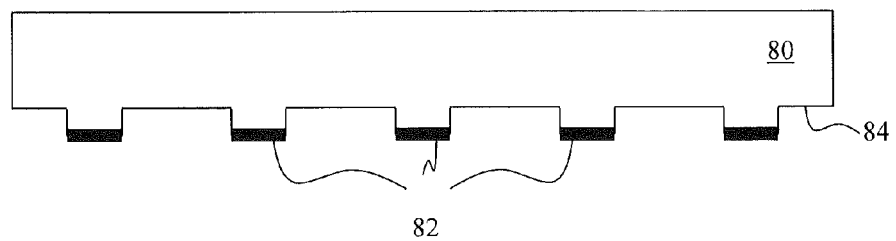
FIG. 2B is a schematic cross-section of a transparent intermediate substrate having a structured surface and an optical mask in accordance with embodiments of the present invention.

An additional or alternative structure is illustrated in FIG. 2B, where the patterned side 84 of the transparent intermediate substrate 80 can include a structured surface as well as the optical mask 82 on protruding portions of the structured surface. Such a structured surface can serve to increase the distance between portions of the transparent intermediate substrate 80 and the active components 22. The increased distance between the transparent intermediate substrate 80 from the active components 22 except in the areas of the optical mask 82 can improve the removal of material between the transparent intermediate substrate 80 and the active components 22, as discussed further below with respect to step 120.

Figure 7A:
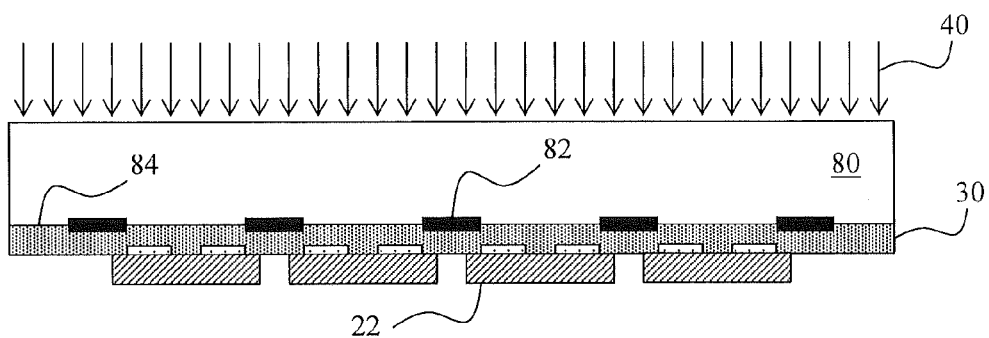
FIG. 7A is a schematic cross-section illustrating the patterned exposure of a photo-sensitive adhesive layer through an optical mask on the transparent intermediate substrate in accordance with embodiments of the present invention.
Figure 18:
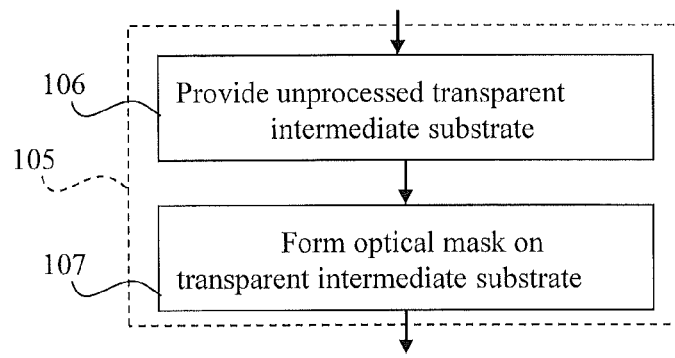
FIG. 18 is a flow diagram illustrating a further method in accordance with embodiments of the present invention.

Referring to FIGS. 2A, 2B, and 16, the transparent intermediate substrate 80 can include a patterned optical mask 82 formed on a patterned side 84 of the transparent intermediate substrate 80. The transparent intermediate substrate 80 can be provided with a patterned optical mask 82 already formed on the patterned side 84. Alternatively, as shown in FIG. 18, an unprocessed transparent intermediate substrate 80 is provided (step 106) and the optical mask 82 is formed from a metal layer or other material opaque to the selected frequencies of electro-magnetic radiation using conventional photo-lithographic processes (step 107). The optical mask 82 is used to selectively provide electro-magnetic radiation to portions of a photo-sensitive material, as illustrated in FIG. 7A. In other embodiments of the present invention, the transparent intermediate substrate 80 does not include a patterned optical mask 82, and another method is used to selectively provide electro-magnetic radiation to portions of a photo-sensitive material, as shown for example in FIG. 7B.

Figure 3:
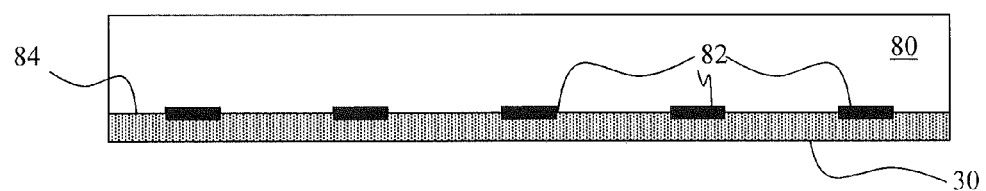
FIG. 3 is a schematic cross-section of a transparent intermediate substrate having an optical mask and a coated photo-sensitive adhesive layer in accordance with embodiments of the present invention.

Referring to FIGS. 3 and 16, a photo-sensitive adhesive layer 30 is coated on the patterned side 84 of the transparent intermediate substrate 80 in step 110. The photo-sensitive adhesive layer 30 can also be formed on the active components 22 on the source substrate 20, or on both the transparent intermediate wafer 80 and the active components 22. The photo-sensitive adhesive layer 30 can be a photo-sensitive polymer or resin, as are commercially available. In some embodiments, the photo-sensitive adhesive layer 30 can be pattern-wise exposed to electromagnetic radiation to form a stronger adhesive bond in desired areas when developed. In some embodiment, the photo-sensitive adhesive layer 30 can be heat sensitive to cure the photo-sensitive adhesive material. Both positive- and negative-acting photo-sensitive materials can be used in embodiments of the present invention. However, as described below by way of example, a material that is cured to form a stronger bond (for example with heat) and then pattern-wise exposed to electromagnetic radiation to weaken the bond in desired areas is employed. In other embodiments, a material that is pattern-wise exposed to form a stronger bond in desired areas can be employed. Positive- and negative-acting pattern-wise bonding processes may be used to achieve these effects.

The photo-sensitive adhesive can be coated as a layer on the patterned side 84 of the transparent intermediate substrate 80 or the active components 22 in various ways, for example by spin or curtain coating or by applying the photo-sensitive material from an adhesive carrier. In embodiments of the present invention, coating the photo-sensitive material as a layer does not limit the methods used to form the photo-sensitive adhesive layer 30 and simply refers to any method or technique employed to form a layer 30 of photo-sensitive adhesive on the patterned side 84.

Figure 4:
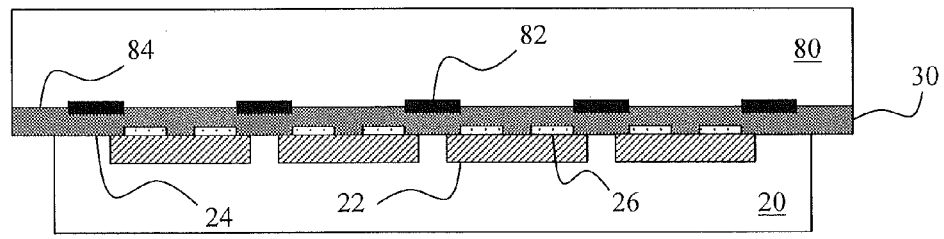
FIG. 4 is a schematic cross-section of a transparent intermediate substrate adhered to a source substrate in accordance with embodiments of the present invention.

As shown in FIG. 4 and referenced in FIG. 16, once the photo-sensitive adhesive layer 30 is applied to the patterned side 84 of the transparent intermediate substrate 80 or the active components 22, the process side 24 of the source substrate 20 is brought into contact with the photo-sensitive adhesive layer 30 and adhered in step 115. If the optical mask 82 is present on the transparent intermediate substrate 80, the optical mask 82 is aligned with the active components 22 on the source substrate 20. The active components 22 and the connection pads 26 are in contact with the photo-sensitive adhesive layer 30. The photo-sensitive adhesive layer 30 can then be cured to a desired bonding or adhesive strength, for example with heat or by waiting the desired length of time, or both. In some embodiments, the photo-sensitive adhesive layer 30 can be patterned and developed before or after the source substrate 20 is brought into contact with the photo-sensitive adhesive layer 30.

Figure 5:
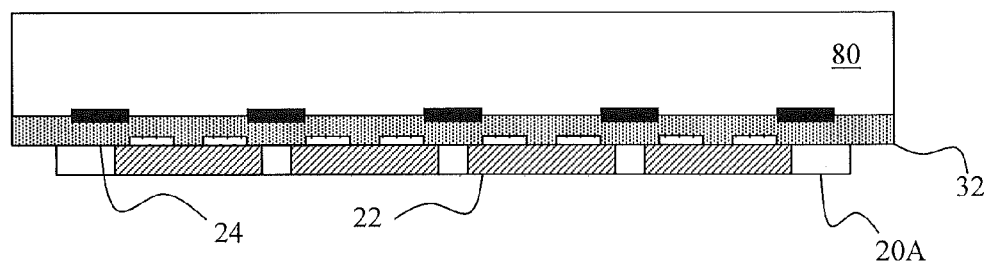
FIG. 5 is a schematic cross-section of active components adhered to the transparent intermediate substrate after removing most of the source substrate in accordance with embodiments of the present invention.
Figure 6:
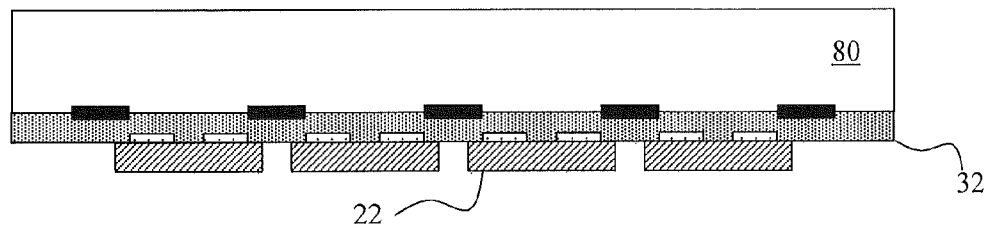
FIG. 6 is a schematic cross-section of active components adhered to the transparent intermediate substrate after patterning and etching the source substrate in accordance with embodiments of the present invention.

Referring to FIG. 5 and step 120 of FIG. 16, portions of the source substrate 20 are removed except for the active components 22. For example the back side of the source substrate 20 opposite the process side 24 can be removed together with any portions of the source substrate 20 that are not part of the active components 22, leaving the singulated active components 22 adhered to the transparent intermediate wafer 80. The active components 22 are singulated by the removal step so that they have independent, separate substrates and do not share a substrate with any other active component 22. As shown in FIGS. 5 and 6, this can be accomplished in two different steps, first removing a majority of the source substrate 20 and secondly removing a remaining minority of the source substrate 20. For example, the majority of the source substrate 20 can be removed by a thinning process such as back-side grinding the source substrate 20 up to the active components 22. Back-side grinding is a process used in the photo-lithographic or semiconductor arts. Once the bulk of the source substrate 20 is removed, the source substrate portions 20A between the active components 22 can be etched away, for example by forming a mask over the active components 22 and employing an etchant, as shown in FIG. 6. Alternatively, if the trenches or wells 21 (FIG. 1) are formed in the source substrate 20, the step of back-side grinding the source substrate 20 can render additional source substrate removal steps unnecessary, if enough material is removed to reach the substrate trenches or wells 21 to thereby singulate the active components 22.

In another embodiment of the present invention, the photo-sensitive adhesive layer 30 can be patterned and developed before or after the source substrate 20 is reduced, or between the first removal step and the second removal step. In yet another embodiment, the majority of the source substrate 20 can be removed before the source substrate 20 is adhered to the transparent intermediate substrate 80. Thus, various embodiments of the present invention can employ various ordering of the source substrate 20 removal steps (step 120), the adhesive layer coating step (110), or the patterning step (125).

A structured surface on the transparent intermediate substrate (as shown in FIG. 2B) can ease or improve the removal of the source substrate material. Furthermore, the presence of the protruding structures on the patterned side 24 of the transparent intermediate substrate 80' can lead to a thinner tether and improve the tether break. The materials in the source substrate portions 20A can include layers and materials, for example dielectric materials, deposited over the source substrate 20 process side 24 to form the active components; these layers and materials in the source substrate portions 20A are removed. Masking and etching processes are used in the integrated circuit arts and any combination of these techniques can be employed and are included in embodiments of the present invention. For example, the entire source substrate 20 (exclusive of the active components 22) can be removed by masking and etching.

Figure 7B:
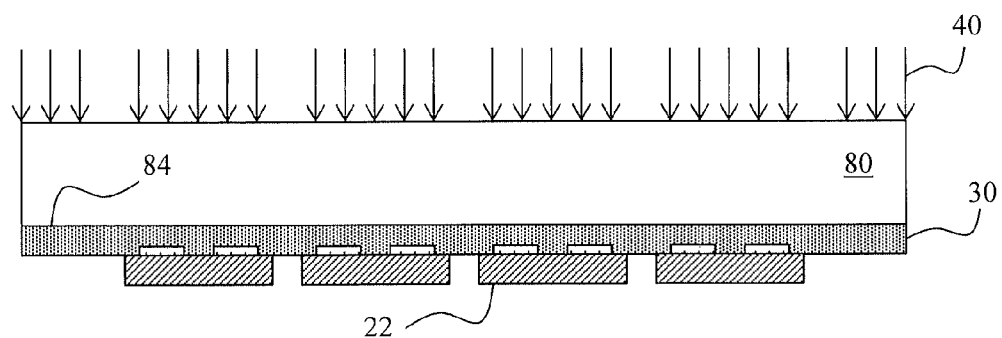
FIG. 7B is a schematic cross-section illustrating the patterned exposure of a photo-sensitive adhesive layer using a patterned laser beam in accordance with embodiments of the present invention.

After the removal of the source substrate 20 (leaving the active components 22 adhered to the transparent intermediate substrate 80), the photo-sensitive adhesive layer 30 is exposed as illustrated in FIG. 7A or 7B and referenced in step 125 of FIG. 16. Note that the order of the exposure and removal steps 125, 120 can be interchanged, depending on the strength of the adhesive bond and the type or technique used for source substrate material removal. For example, the photo-sensitive adhesive layer 30 could be only lightly cured as adequate for a subsequent source substrate 20 grind or etch process step, and then exposed. Thus positive- or negative-acting photo-sensitive adhesive materials can be used to form the adhesive layer 30 in various embodiments of the present invention.

Figure 8A:
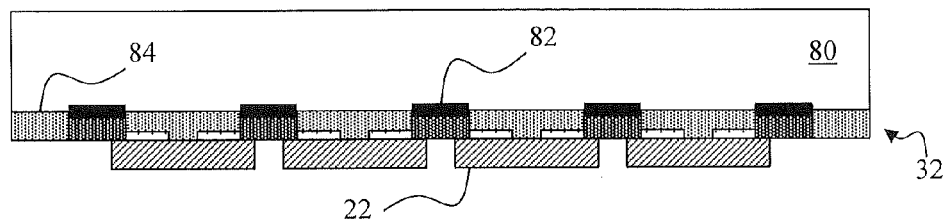
FIG. 8A is a schematic cross-section of a source substrate having active components pattern-wise adhered to the transparent intermediate substrate in accordance with embodiments of the present invention.
Figure 8B:
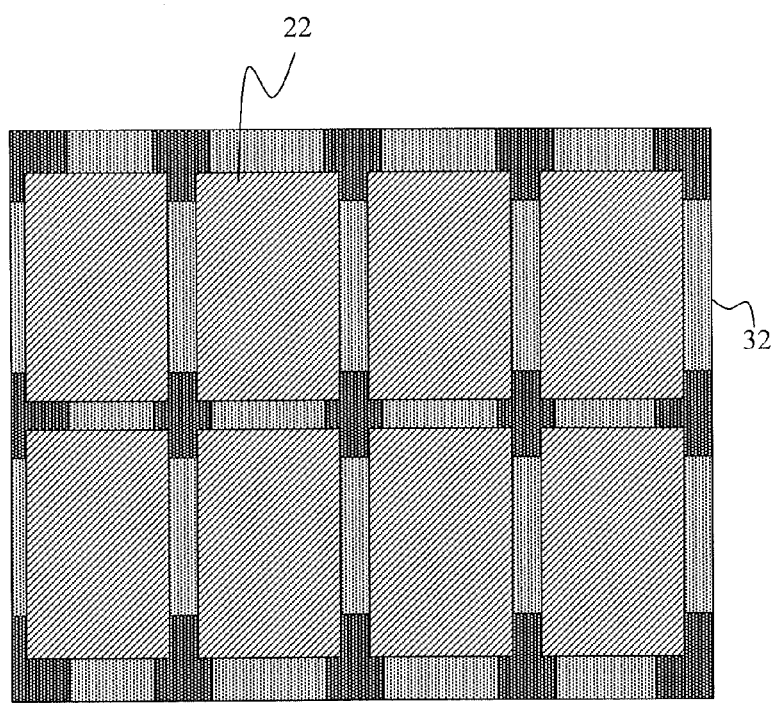
FIG. 8B is a schematic bottom view of the structure of FIG. 8A.

Referring to FIG. 7A, a blanket exposure of radiation 40 is provided through the transparent intermediate substrate 80 onto the photo-sensitive adhesive layer 30. The optical mask 82 on the patterned side 84 prevents exposure in undesired areas of the photo-sensitive adhesive layer 30. Alternatively, as shown in FIG. 7B, a selective or patterned exposure of electromagnetic radiation is provided in alignment with the source substrate 20 to expose the desired portions of the photo-sensitive adhesive layer 30 only, for example by using one or more laser beams to sequentially expose the desired portions. Masks external to the transparent intermediate substrate 80 can also be employed. In both the embodiment of FIG. 7A and the embodiment of FIG. 7B, the patterned electro-magnetic radiation exposure provides differential bonding strength in the photo-sensitive adhesive layer 30 to form tethers connecting the active components 22 to the transparent intermediate substrate 80 as shown in FIG. 8A. In FIG. 8A, darker and lighter portions illustrate the differentially exposed portions of the patterned photo-sensitive adhesive layer 32. FIG. 8B shows the active components 22 and the differentially exposed patterned photo-sensitive adhesive layer 32 with a schematic bottom-view.

Figure 9A:
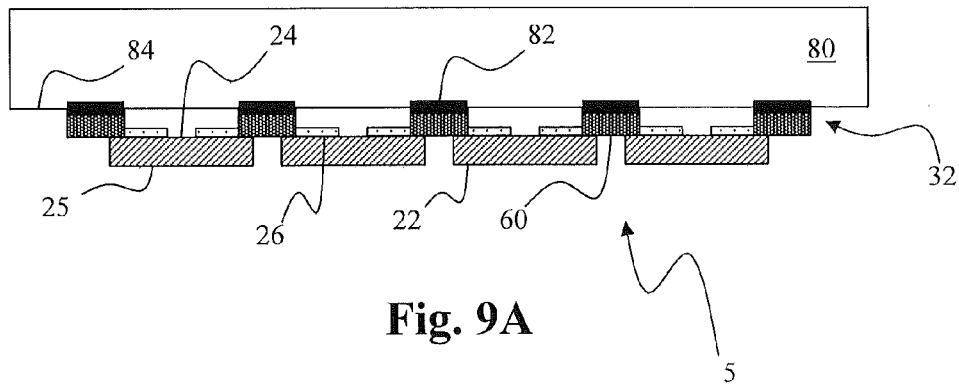
FIG. 9A is a schematic cross-section of a source substrate having active components pattern-wise adhered to the transparent intermediate substrate according to some embodiments of the present invention.
Figure 9B:
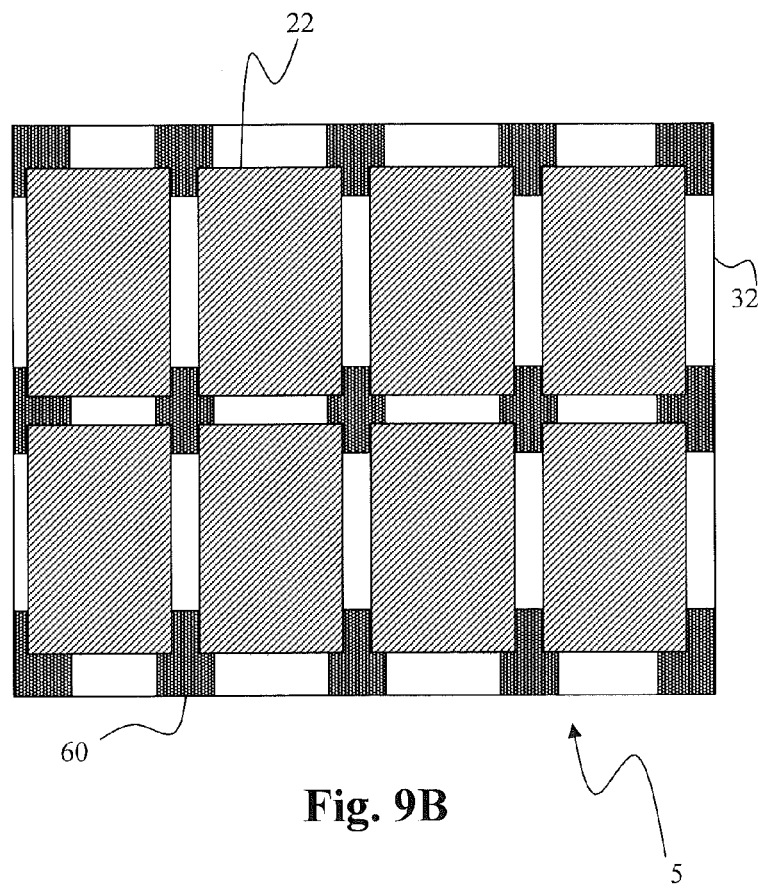
FIG. 9B is a schematic bottom view of the structure of FIG. 9A.

Referring to FIG. 9A and as referenced in step 130 of FIG. 16, the portions of the patterned photo-sensitive adhesive layer 32 that do not form the tethers 60 are removed, for example by washing with a suitable liquid. Washing adhesive materials as part of a mask formation process is a technique used in the photo-lithographic arts. FIG. 9B shows the active components 22, the differentially exposed layer patterned photo-sensitive adhesive 32, and the tethers 60 with a schematic bottom-view.

The tethers 60 formed in the patterned photo-sensitive adhesive layer 32 and shown in FIG. 9A serve to physically connect the active components 22 to the patterned side 84 of the transparent intermediate substrate 80. The tethers 60 can be relatively small and thin, to readily enable removal of the active components 22 from the transparent intermediate substrate 80 by breaking the tethers 60 as described further below. In various embodiments of the present invention, the active components 22 have various numbers of individual tethers 60. Alternatively, a single tether 60 can be connected to multiple active components 20. The number and location of tethers 60 connecting the active components 22 to the transparent intermediate substrate 80 are a matter of design choice. The tethers 60 are formed in a layer between the active components 22 and the transparent intermediate substrate 80. The active components 22 and the transparent intermediate substrate 80 also form layers so that the active components 22, the transparent intermediate substrate 80, and the tethers 60 are all in different layers so that the tethers 60 form a bridge between the active component layer and the transparent intermediate substrate layer and extend in a direction perpendicular to the layers.

Figure 9C:
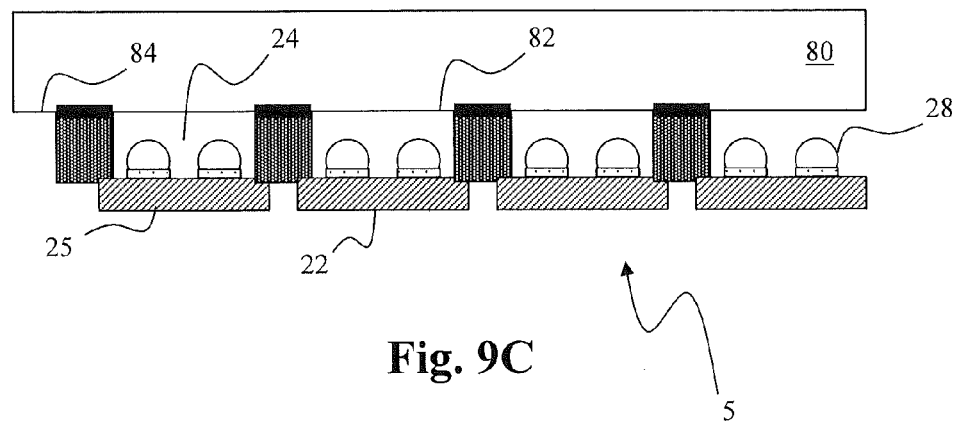
FIG. 9C is a schematic cross-section of the structure of FIG. 9A having conductive material on the connection pads according to another embodiment of the present invention.

Referring to FIG. 9C, various conductive or adhesive materials 28 can be coated or placed on the connection pads 26 prior to pressing the stamp 90 against the active components 22 (step 145). Such materials can include materials intended to promote adhesion between the active components and other substrates (as described further below), for example materials such as solder or tin or to promote conduction. The deposition of such materials (e.g. solder balls) is used in the art.

Figure 9D:
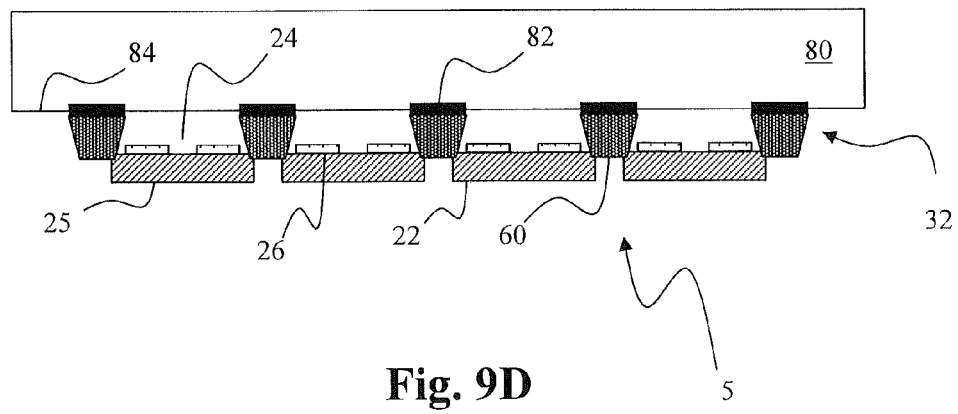
FIG. 9D is a schematic cross-section of the structure of FIG. 9A having shaped tethers according to another embodiment of the present invention.
Figure 9E:
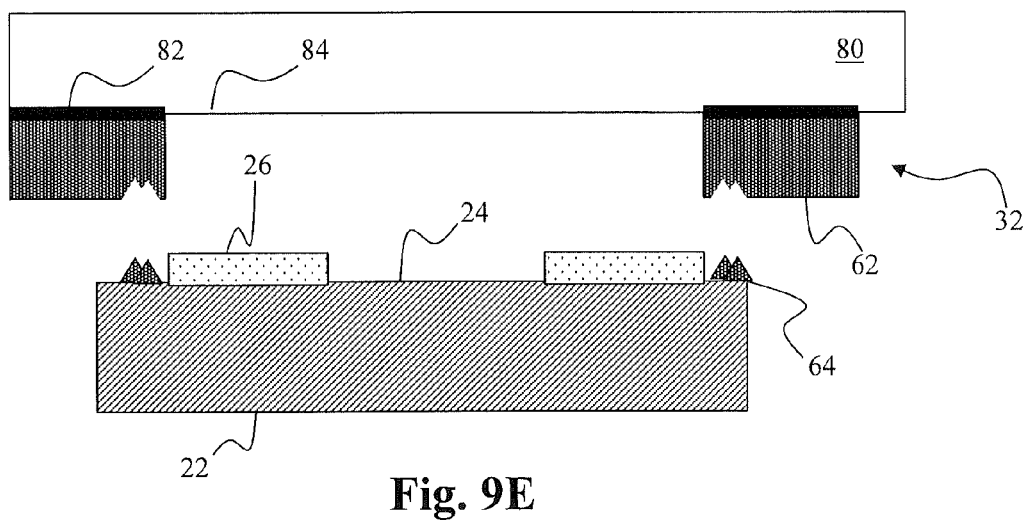
FIG. 9E is a schematic cross-section illustrating particulate contamination from fractured tethers according to another embodiment of the present invention.

Referring to FIG. 9D, the tethers 60 can be shaped using various processing techniques, such as chemical etching or laser ablation prior to pressing the stamp 90 against the active components 22 (step 145). Such shaping can enhance the transfer of active components 22 to the stamp 90 described below with reference to FIG. 10 by improving characteristics associated with breaking the tethers 60. For example, the tethers 60 can be shaped to improve their predictability in breaking, reduce the force required to break the tethers 60, control the location of the breaks, reduce the number of particulates generated by the breaks, and/or control the location of particulates generated by the break. Referring to FIG. 9E for example, a tether break can be controlled so that any fracture residue is below the bonding surface of the connection pad 26. Thus, any particulates 64 generated from the fracture are not located on the surface of the connection pads 26 and do not interfere with conductivity and/or adhesion to the surface of the connection pad 26.

Thus, FIGS. 9A, 9B, 9C, and 9D illustrate various transfer devices 5 of the present invention. In some embodiments of the present invention, the transfer device 5 comprises a transparent intermediate substrate 80 having a patterned side 84, a patterned photo-sensitive adhesive layer 32 adhered to the patterned side 84 of the transparent intermediate substrate 80, and a plurality of singulated active components 22 adhered to the patterned photo-sensitive adhesive layer 32. The patterned photo-sensitive adhesive layer 32 is located between the patterned side 84 of the transparent intermediate substrate 80 and the singulated active components 22. The patterned photo-sensitive adhesive layer 32 forms tethers 60 physically connecting the active components 22 to the patterned side 84 of the transparent intermediate substrate 80 responsive to exposure to electromagnetic radiation. The transfer device 5 can included an optical mask 82 formed on the patterned side 84 of the transparent intermediate substrate 80. The patterned photo-sensitive adhesive layer 32 can be a photo-sensitive polymer. The tethers 60 can be breakable tethers and the transparent intermediate substrate 80 can be a quartz substrate. The singulated active components 22 can have a process side 24 and a different back side 25 opposite the process side 24. Connection pads 26 are formed on the process side 24 and the process side 24 is adhered to the patterned photo-sensitive adhesive layer 32. A singulated active component 22 is an active component 22 that has a separate substrate and does not share a substrate with any other active component 22. The tethers 60 are not part of an active component 22 substrate or the transparent intermediate substrate 80.

As shown in FIGS. 1-9 and as illustrated in the flow diagram of FIG. 16, a method for selectively transferring active components 22 from a source substrate 20 to an transparent intermediate substrate 80 comprises providing a source substrate 20 having a process side 24 and a plurality of active components 22 formed on or in the process side 24 of the source substrate 20. A transparent intermediate substrate 80 having a patterned side 84 is provided. A photo-sensitive adhesive layer 30 is coated on the patterned side 84 of the transparent intermediate wafer 80. The patterned side 84 of the transparent intermediate substrate 80 is adhered to the process side 24 of the source substrate 20. Portions of the source substrate 20 are removed, leaving the active components 22 adhered to the patterned side 84 of the transparent intermediate substrate 80. The photo-sensitive adhesive layer 30 is exposed to patterned electromagnetic radiation 40 to provide differential adhesion in the photo-sensitive adhesive layer 30. Portions of the patterned photo-sensitive adhesive layer 32 are then selectively removed according to the electromagnetic radiation pattern, thereby forming tethers 60 physically connecting the active components 22 to the transparent intermediate substrate 80.

Figure 14:
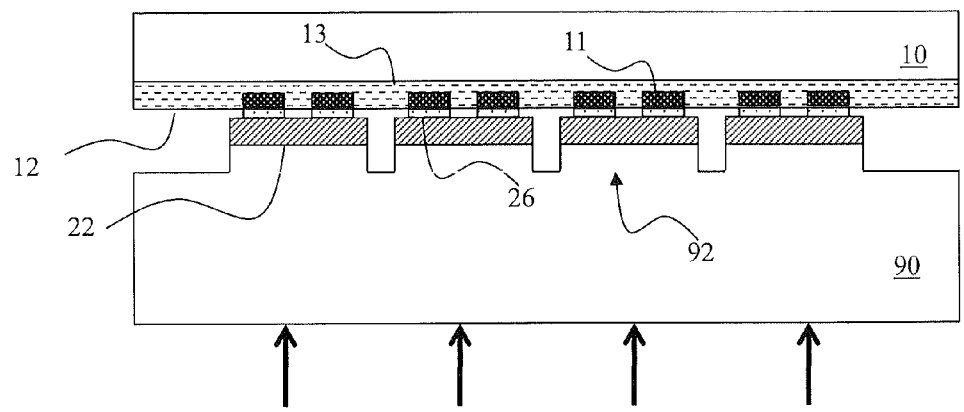
FIG. 14 is a schematic cross-section of active components adhered to the stamp pillars and pressed against the receiving side of the destination substrate in accordance with embodiments of the present invention.
Figure 15:
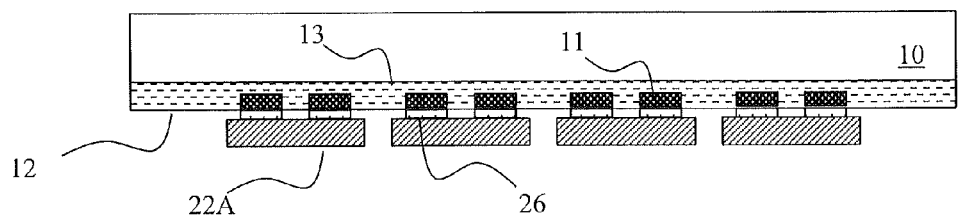
FIG. 15 is a schematic cross-section of active components adhered to the receiving side of the destination substrate in accordance with embodiments of the present invention.
Figure 19:
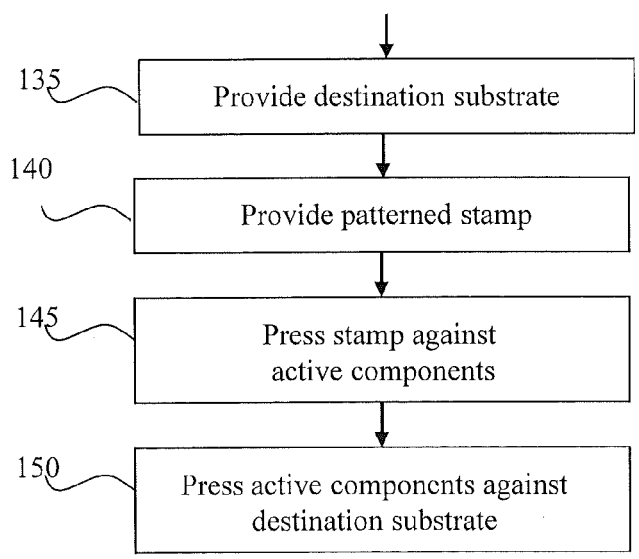
FIG. 19 is a flow diagram illustrating yet another method in accordance with embodiments of the present invention.

In a further embodiment of the present invention, the active components 22 adhered to the transparent intermediate substrate 80 are transferred to a destination substrate 10. Referring to FIG. 19 and FIGS. 14-15 described below, a destination substrate 10 having a receiving side 12 is provided in step 135 on which the active components 22 are to be located. The receiving side 12 of the destination substrate 10 can be processed and can include a variety of layers and elements, for example conductors, connectors, connection pads, solder materials, insulators, or functional elements such as integrated circuits. These receiving side elements can serve to electrically connect the active components 22 to the destination substrate 10 and provide power, ground, and control signals as desired to make use of the functionality provided by the active components 22.

Figure 10:
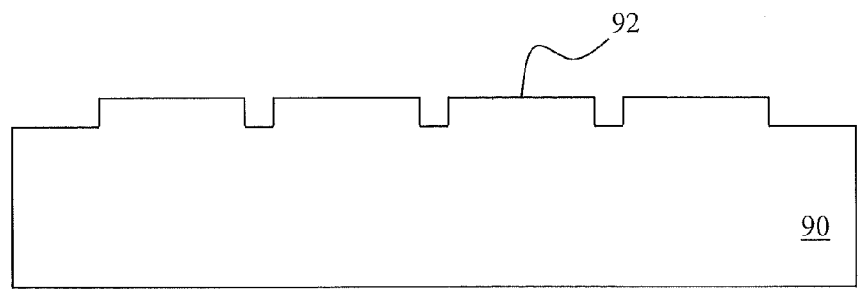
FIG. 10 is a schematic cross-section of a stamp having a pattern of pillars in accordance with embodiments of the present invention.

Referring to FIG. 10 and step 140 of FIG. 19, a patterned stamp 90 is provided. The patterned stamp 90 has pillars 92 that can be shaped to match the shape of the active components 22. The stamp 90 can be made of an elastomeric material such as PDMS and the pillars 92 formed using methods described in greater detail in the paper "AMOLED Displays using Transfer-Printed Integrated Circuits" referenced above.

Figure 11:
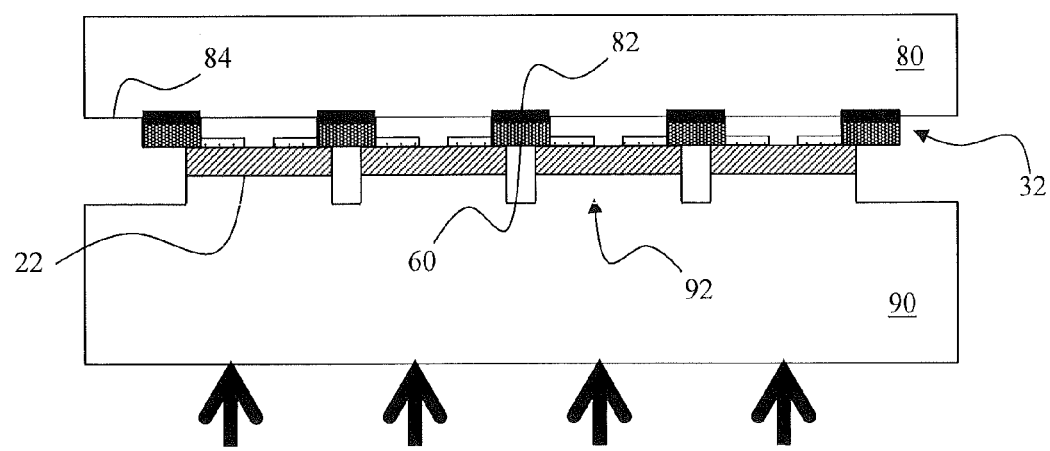
FIG. 11 is a schematic cross-section of a stamp having a pattern of pillars pressed against active components adhered to the transparent intermediate substrate in accordance with embodiments of the present invention.
Figure 12:
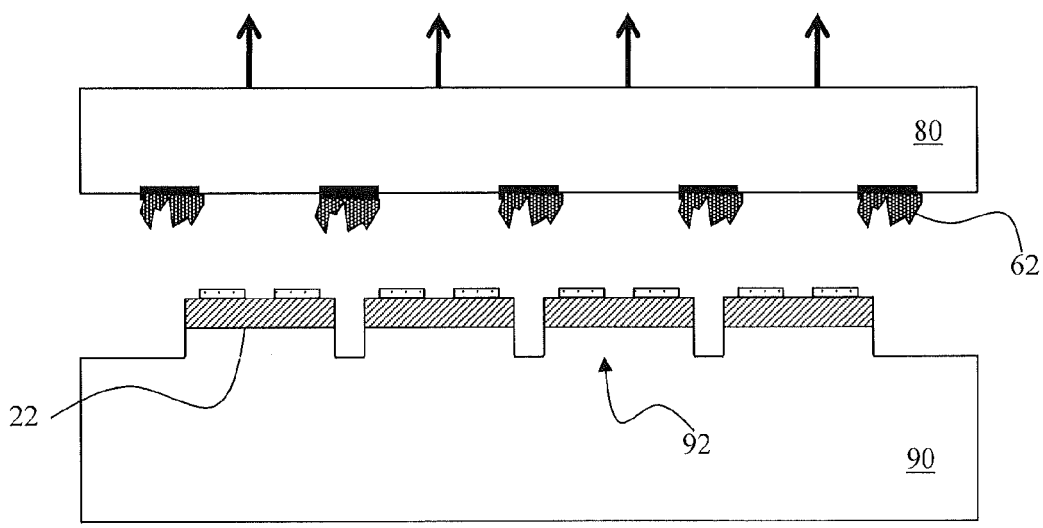
FIG. 12 is a schematic cross-section of active components adhered to the stamp pillars with broken tethers on the transparent intermediate substrate in accordance with embodiments of the present invention.
Figure 13:
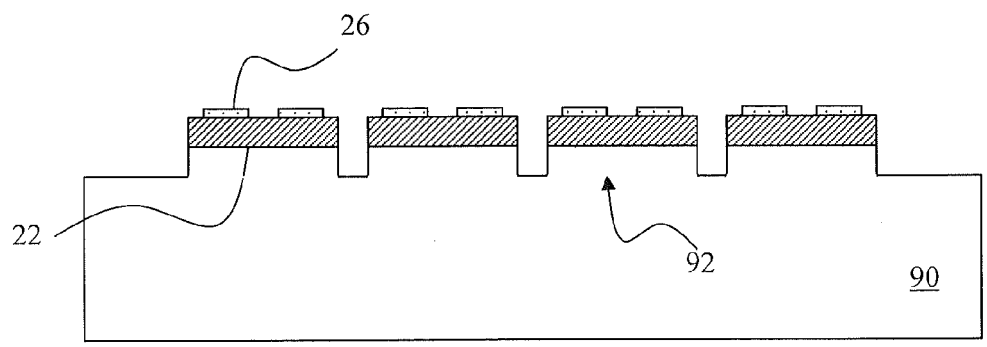
FIG. 13 is a schematic cross-section of active components adhered to the stamp pillars in accordance with embodiments of the present invention.

The pillars 92 of the patterned stamp 90 are aligned with the active components 22 adhered to the transparent intermediate substrate 80 as shown in FIG. 11 and referenced in step 145 of FIG. 19. The stamp 90 and pillars 92 are pressed against the active components 22 adhered to the patterned photo-sensitive adhesive layer 32, the optical mask 82 (if present) and the patterned side 84 of transparent intermediate substrate 80, thereby breaking the tethers 60 and adhering the active components 22 to the pillars 90, for example with van der Waal's forces. Although each active component 22 is illustrated in FIG. 11 pressed against a corresponding pillar 92, in various embodiments of the present invention fewer pillars 92 may be provided so that only a subset of the active components 22 are removed. Referring to FIG. 12, the broken tethers 62 and the transparent intermediate substrate 80 are then removed, leaving the back side of the active components 22 adhered to the pillars 92 of the stamp 90, as shown in FIG. 13. The connection pads 26 of the active components 22 are exposed.

The active components 22 are then adhered to the receiving side 12 of the destination substrate 10, as shown in FIG. 14 and referenced in step 150 of FIG. 19, by pressing the active components 22 on the stamp 90 pillars 92 in alignment to any receiving side 12 structures, elements, or destination receiving side layers 13, for example destination substrate conductive contacts 11. The receiving side 12 can include an adhesive layer, which can be patterned and/or conductive, to adhere the active components 22 to the destination substrate 10. The stamp 90 is then removed from the receiving side 12, leaving the transferred active components 22A adhered to the destination substrate 10, as illustrated in FIG. 15.

Other transfer methods can also be used to transfer active components 22 from the transparent intermediate substrate 80 to the destination substrate 10. For example, for larger integrated circuit devices, pick-and-place technologies can be employed, such as vacuum adhesion, for either single or multiple die transfer.

Figure 20:
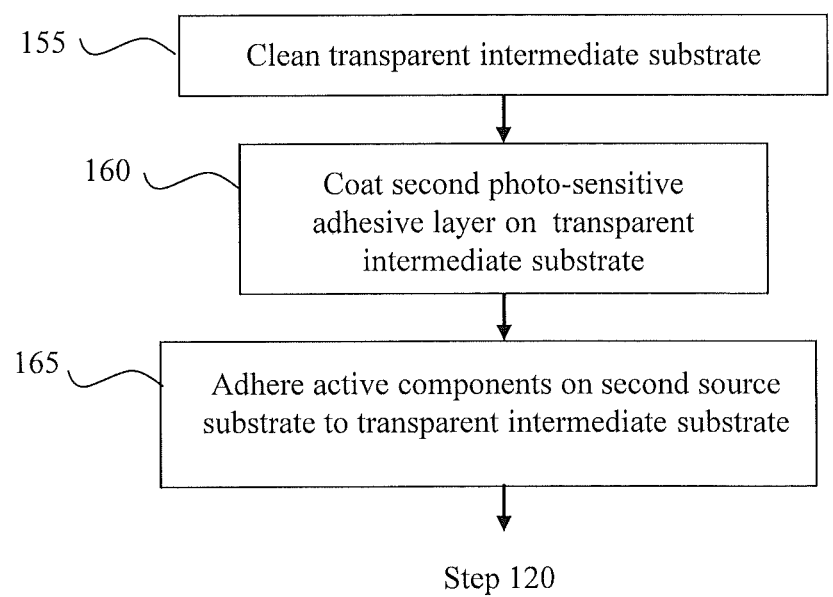
FIG. 20 is a flow diagram illustrating a method in accordance with embodiments of the present invention.

In further embodiments of the present invention, referring to FIG. 20, the transparent intermediate substrate 80 can be cleaned in step 155 by removing any remaining portions of the photo-sensitive adhesive layer 30 from the transparent intermediate substrate 80. In other embodiments, the optical mask can also be removed. The transparent intermediate substrate 80 can then be reused in step 160 by coating a second photo-sensitive adhesive layer 30 on the patterned side 84 of the transparent intermediate wafer 80 and adhering the process side 24 of a second source substrate 20 to the patterned side 84 of the transparent intermediate substrate 80 in step 165. Thus, the transparent intermediate substrate 80 can be reused.

Embodiments of the present invention provide advantages over other printing methods, for example, as discussed in the paper referenced above. By employing a transparent intermediate substrate 80, robust and inexpensive processes and materials used in the integrated circuit and photolithographic industries can be employed to transfer active components 22 from a source substrate 20 to a destination substrate 10. For example, silicon foundry and back-side grinding techniques may be readily employed. Furthermore, as described above, the methods and transfer devices of embodiments of the present invention enable the adhesion of the process side 24 and connection pads 26 of the active components 22 adjacent to the receiving side 12 of the destination substrate 10, simplifying electrical connections between the active components 22 and any devices or structures on the destination substrate 10 and reducing process steps. Moreover, the transparent intermediate substrate 80 can be reused, reducing costs. These processes can also be employed with flexible destination substrates and substrates that are less tolerant of chemical or high temperature process steps.

The source substrate 20, destination substrate 10, stamp 90, and transparent intermediate substrate 80 can be made separately, at different times, and/or in different temporal orders or locations and provided in various process states.

The photo-sensitive adhesive layer 30 can be located on the patterned side 84 of the transparent intermediate substrate 80 (as illustrated FIG. 3), or it can be applied to the active components 22 and process side 24 of the source substrate 20. When the transparent intermediate substrate 80 is removed from the active components 22, a portion of the patterned photo-sensitive adhesive layer 32 and the broken tethers 62 can be adhered to the active components 22. The active components 22 can be cleaned prior to transferring the active components 22 to the receiving side 12 of the destination substrate 10.

Suitable photo-sensitive adhesive materials, for example UV-curable adhesive resins, are used in the photo-lithographic industry. Adhesives can be applied, for example, as a film on a carrier that is applied to a substrate and the carrier can be subsequently removed, for example by peeling, leaving an adhesive film on the substrate. Additionally or alternatively, uncured liquid adhesives can be coated, for example by spin coating or curtain coating, or other coating methods. The selectively curable photo-sensitive adhesive layer 30 can also or alternatively be applied to the active components 22 and on the source substrate 20. A photo-sensitive adhesive, as used herein, is a material (dry or liquid) that can be cured in some areas, but not others, for example, by the patterned application of photonic energy (e.g., electromagnetic energy such as ultra-violet radiation or light). A laser can be used to provide light or heat to selected areas either to enhance adhesion or to degrade adhesion.

According to various embodiments, a variety of materials can be used for various elements in the invention. The selectively curable photo-sensitive adhesive layer 30 can include materials that improve the absorption of light or heat, to improve the rate of curing, for example dyes. The radiation pattern corresponds to the spatial area cured. A wide variety of substrate materials can be employed, for example glass, polymers, quartz, and silicon. In particular, glass substrates are used in various industries such as display, radiography, and photo-voltaics. A variety of active components 22 may be used, for example, such as active components formed in layers of silicon. In one embodiment of an active component 22, thin-film transistors are photo-lithographically formed on a thin silicon layer sputtered and possibly processed on a glass substrate. However, such active components 22 typically have lower performance and are mechanically fragile, which may lead to damage during the transfer process and can lack adequate mechanical robustness.

In some embodiments, the active components 22 are small integrated circuits formed in a semiconductor wafer source substrate 20, for example gallium arsenide or silicon, which can have a crystalline structure. Processing technologies for these materials typically employ high heat and reactive chemicals. However, by employing transfer technologies that do not stress the active component 22 or substrate materials, more benign environmental conditions can be used as compared to thin-film manufacturing processes. Thus, embodiments of the present invention provide advantages in that flexible substrates that are typically intolerant of extreme processing conditions (e.g. heat, chemical, or mechanical processes) can be employed as the destination substrates 10. Furthermore, it has been demonstrated that crystalline silicon substrates have strong mechanical properties and, in small sizes, can be relatively flexible and tolerant of mechanical stress. This is particularly true for substrates of about 5 micron, 10 micron, 20 micron, 50 micron, or even 100-micron thicknesses. Additionally or alternatively, the active components 22 can be formed in a microcrystalline, polycrystalline, or amorphous semiconductor layer.

The active components 22 can be constructed using foundry fabrication processes. Layers of materials can be used, including materials such as metals, oxides, nitrides and other materials used in the integrated-circuit art. Each active component 22 can be a complete semiconductor integrated circuit and can include, for example, transistors. The active components 22 can have different sizes, for example, about 1000 square microns or about 10,000 square microns, about 100,000 square microns, or about 1 square mm, or larger, and can have variable aspect ratios, for example about 1:1, 2:1, 5:1, or 10:1. The active components 22 can be rectangular or can have other shapes.

The stamp 90 can be flat or structured, for example with pillars 92 matched to the shapes, sizes, and locations of the active components 22 to enhance adhesion. The stamp 90 can be elastomeric, for example made of PDMS, rubber, or a reinforced composite.

The adhesion between the active components 22 and the receiving side 12 of the destination substrate 10 should be greater than the adhesion between the active components 22 and the stamp 90. When the stamp 90 is removed from the receiving side 12 of the destination substrate 10, the active components 22 must adhere more strongly to the receiving side 12 than to the stamp 90, in order to transfer the active components 22 from the stamp 90 to the receiving side 12 of the destination substrate 10.

In one embodiment of the method, the stamp 90 adheres only a subset of the active components 22, for example a subset array of the available active components 22 on the transparent intermediate substrate 80. Subsequent stamping steps can then remove different subset arrays of active components 22 from the transparent intermediate substrate 80 and stamp them in different locations on the destination substrate 10 to form a sparse array of active components 22 adhered to the receiving side 12 of the destination substrate 10.

In other embodiments, all of the active components 22 within an array on the transparent intermediate wafer 80 are removed from the transparent intermediate wafer 80 and adhered to the stamp 90. Likewise, all of the removed active components 22 are stamped onto the receiving side 12 of the destination substrate 10. However, only selected active components 22, for example a subset array of the active components 22 on the stamp 90 are adhered to the destination substrate 10 by selectively curing areas of an adhesive layer formed on the receiving side 12 and corresponding to the selected active components 22. The stamp 90 is then removed from the destination substrate 10 and can be reapplied elsewhere on the destination substrate 10 to selectively adhere another different subset array of active components 22 to another different destination substrate area. In this embodiment, there is no need to repeatedly press the stamp 90 against the transparent intermediate wafer 80, but the adhesion of the active components 22 to the stamp 90 must be stronger than the uncured adhesion to the destination substrate 10 and weaker than the cured adhesion to the destination substrate 10.

Referring to the flow diagrams of FIGS. 16 and 20, the methods of embodiments of the present invention can be iteratively applied to a single or multiple destination substrates 10. By repeatedly transferring sub-arrays of active components 22 from a stamp 90 to a destination substrate 10 and relatively or laterally moving the stamp 90 and destination substrates 10 between stamping operations a distance equal to the spacing of the selected active components 22 in the transferred sub-array between each transfer of active components 22, an array of active components 22 formed at a high density on a source substrate 20 can be transferred to a destination substrate 10 at a lower density. In practice, the source substrate 20 is likely to be expensive, and forming active components 22 with a high density on the source substrate 20 can reduce the cost of the active components 22, especially as compared to forming active components on the destination substrate 10. Transferring the active components 22 to a lower-density destination substrate 10 can be used, for example, if the active components 22 manage elements distributed over the destination substrate 10, for example in a display, digital radiographic plate, or photovoltaic system.

In particular, in the case wherein the active component 22 is an integrated circuit formed in a crystalline semiconductor material, the integrated circuit substrate provides sufficient cohesion, strength, and flexibility that it can adhere to the destination substrate 10 without breaking as the stamp 90 is removed.

In various methods of the present invention, laser beams are used to selectively cure selected adhesive areas. In one embodiment, the selected areas can be sequentially exposed. In another embodiment, multiple areas can be simultaneously exposed, thereby increasing the number of selected active components simultaneously adhered. Such selective exposure can enable the selection of known good die, by ensuring that only tethers associated with known good die are patterned for transfer. Thus, methods of the present invention include selectively exposing the photo-sensitive adhesive layer 30 to differentially adhere active components 22 to the transparent intermediate substrate 80. The method can further include selectively exposing the photo-sensitive adhesive layer 30 to differentially adhere electrically defective active components. Selective adhesion of the active components 22 can be accomplished by controlling the size of the tethers 60 or by adhering the active components 22 itself to the transparent intermediate substrate 80 or to the source substrate 20. Active components 22 can be tested while still on the source substrate 20. In this way, active components 22 known to be defective can be prevented from being transferred from one substrate to another substrate.

Other methods employing a mask can also adhere multiple selected active components at one time. Methods for scanning and controlling lasers can be employed, as well as light sources used in conjunction with aligned masks, particularly as are used in the photo-lithographic arts.

In comparison to thin-film manufacturing methods, using densely populated source substrates 20 and transferring active components 22 to a destination substrate 10 that requires only a sparse array of active components 22 located thereon does not waste or require active layer material on a destination substrate 10. Embodiments of the present invention may also be used in transferring active components 22 made with crystalline semiconductor materials that have higher performance than thin-film active components. Furthermore, the flatness, smoothness, chemical stability, and heat stability requirements for a destination substrate 10 used in embodiments of the present invention are reduced because the adhesion and transfer process is not significantly limited by the destination substrate material properties. Manufacturing and material costs may be reduced because of high utilization rates of expensive materials (e.g. the source substrate) and reduced material and processing requirements for the destination substrate.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the specification, there have been disclosed embodiments of the invention and, although specific terms are employed, they are used in a generic and descriptive sense only and not for purposes of limitation. The following claims are provided to ensure that the present application meets all statutory requirements as a priority application in all jurisdictions and shall not be construed as setting forth the scope of the present invention.

That which is claimed:

1. A method of printing transferable components, the method comprising:

forming a photo-sensitive adhesive layer on a process side of a source substrate including active components or on a patterned side of a transparent intermediate substrate;

contacting the transparent intermediate substrate with the source substrate to adhere the active components on the process side to the patterned side of the transparent intermediate substrate via the photo-sensitive adhesive layer therebetween;

removing portions of the source substrate opposite the process side to singulate the active components;

selectively exposing portions of the photo-sensitive adhesive layer to electromagnetic radiation through the transparent intermediate substrate to alter an adhesive strength thereof; and then selectively removing portions of the photo-sensitive adhesive layer having a weaker adhesive strength to define breakable tethers comprising portions of the adhesive layer having a stronger adhesive strength, wherein the breakable tethers physically secure the active components to the transparent intermediate substrate.

2. The method of claim 1, wherein selectively exposing comprises:
forming a mask pattern on the transparent intermediate substrate; and
exposing the transparent intermediate substrate to the electromagnetic radiation,
wherein the mask pattern comprises a material configured to block transmission of the electromagnetic radiation therethrough such that the portions of the photo-sensitive adhesive layer exposed by the mask pattern are selectively exposed to the electromagnetic radiation.

3. The method of claim 2, wherein the patterned side of the transparent intermediate substrate includes a plurality of structures protruding therefrom, and wherein the mask pattern is formed on surfaces of the protruding structures.

4. The method of claim 1, wherein the tethers extend in a direction perpendicular to the transparent intermediate layer and are shaped to break in a desired manner.

5. The method of claim 1, wherein the active components have respective primary surfaces including conductive elements thereon adjacent the process side of the source substrate and respective secondary surfaces opposite the primary surfaces, and
wherein the portions of the adhesive layer defining the tethers physically connect the respective the primary surfaces of the active components to the transparent intermediate substrate.

6. The method of claim 5, further comprising:
pressing a stamp having pillars protruding therefrom against the active components on the transparent intermediate substrate and separating the stamp from the transparent intermediate substrate to break the tethers and adhere the respective secondary surfaces of the active components to respective transfer surfaces of the pillars of the stamp; and
contacting the stamp including the active components on the pillars thereof with a destination substrate to adhere the respective primary surfaces of the active components including the conductive elements thereon to a receiving surface of the destination substrate.

7. The method of claim 6, wherein the conductive elements on the respective primary surfaces of the active components are adhered to respective electrical contacts on the receiving surface of the destination substrate.

8. The method of claim 6, wherein the primary surfaces of the active components respectively include a photo-adhesive layer residue thereon comprising respective portions of the breakable tethers, wherein the residue is below respective surfaces of the conductive elements.

9. The method of claim 1, wherein selectively exposing comprises:
selectively exposing the portions of the photo-sensitive adhesive layer to differentially adhere ones of the active components to the transparent intermediate substrate.

10. The method of claim 1, further comprising:
providing the source substrate having the process side and the active components adjacent the process side of the source substrate;
providing the transparent intermediate substrate having the patterned side;
providing the photo-sensitive adhesive layer on the patterned side of the transparent intermediate wafer or on the active components;
adhering the patterned side of the transparent intermediate substrate to the process side of the source substrate via the photo-sensitive adhesive layer;
removing the portions of the source substrate to singulate the active components and adhere the singulated active components to the patterned side of the transparent intermediate substrate;
selectively exposing the photo-sensitive adhesive layer to the electromagnetic radiation to alter the adhesive strength thereof such that the portions of the photo-sensitive adhesive layer have a weaker adhesive strength than other portions thereof; and
selectively removing the portions of the photo-sensitive adhesive layer having the weaker adhesive strength to define the breakable tethers comprising the other portions of the photo-sensitive adhesive layer that physically connect the singulated active components to the transparent intermediate substrate.

11. The method of claim 10, further including forming an optical mask on the patterned side of the transparent intermediate substrate and selectively exposing the photo-sensitive adhesive layer to electromagnetic radiation through the optical mask.

12. The method of claim 10, further including selectively exposing the photo-sensitive adhesive layer to electromagnetic radiation with a patterned laser beam.

13. The method of claim 12, further including selectively exposing the photo-sensitive adhesive layer to differentially adhere ones of the active components.

14. The method of claim 13, further including selectively exposing the photo-sensitive adhesive layer to differentially adhere electrically defective ones of the active components.

15. The method of claim 10, further including:
providing a destination substrate having a receiving side;
providing a patterned stamp having a plurality of pillars, each pillar spatially corresponding to an active component;
pressing the stamp pillars against the active components to detach the active components from the transparent intermediate substrate, thereby adhering the active components to the stamp pillars; and
pressing the active components against the receiving side of the destination substrate with the stamp to adhere the active components to the destination substrate.

16. The method of claim 15, further including:
removing remaining portions of the photo-sensitive adhesive layer from the transparent intermediate substrate.

17. The method of claim 16, further including:
coating a second photo-sensitive adhesive layer on the patterned side of the transparent intermediate wafer; and
adhering the process side of a second source substrate to the patterned side of the transparent intermediate substrate.

18. The method of claim 15, further including breaking the tethers.

19. The method of claim 10, further including providing a source substrate that is a semiconductor wafer, a silicon wafer, or a gallium arsenide wafer.

20. The method of claim 10, further including providing active components that include a crystalline, a microcrystalline, a polycrystalline, or an amorphous semiconductor material.

21. The method of claim 10, further including first removing the majority of the source substrate in a first step and removing a minority of the source substrate in a second step different from the first step.

22. The method of claim 21, further including removing a portion of the source substrate before the transparent intermediate substrate is adhered to the source substrate.

23. The method of claim 10, further including exposing the photo-sensitive adhesive layer to patterned electromagnetic radiation before the source substrate is adhered to the transparent intermediate substrate, after the source substrate is adhered to the transparent intermediate substrate, after portions of the source substrate are removed, or after a first portion of the source substrate is removed but before a second portion of the source substrate is removed.

24. The method of claim 10, further including grinding or etching back the source substrate leaving the active components on the process side adhered to the patterned side of the transparent intermediate substrate.

25. The method of claim 10, wherein the tethers physically connect the active components in a component layer to the transparent intermediate substrate in a substrate layer, wherein the tethers are formed in a tether layer that is between the component layer and the substrate layer, and wherein the component layer, the tether layer, and the substrate layer are all different layers.

26. The method of claim 10, further including coating the photosensitive adhesive layer from an adhesive carrier.

27. The method of claim 10, further including providing a transparent intermediate substrate with protruding structures on the patterned side.

28. The method of claim 10, further including using chemical processes or laser ablation to shape the tethers.

* * * * *